United States Patent
Zhang et al.

(10) Patent No.: US 10,096,506 B2
(45) Date of Patent: Oct. 9, 2018

(54) REDUCING TEMPERATURE TRANSITION IN A SUBSTRATE SUPPORT

(71) Applicant: LAM RESEARCH CORPORATION, Fremont, CA (US)

(72) Inventors: Tao Zhang, San Ramon, CA (US); Ole Waldmann, Oakland, CA (US); Eric A. Pape, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/897,669

(22) Filed: Feb. 15, 2018

(65) Prior Publication Data

US 2018/0174879 A1   Jun. 21, 2018

Related U.S. Application Data

(63) Continuation of application No. 15/692,002, filed on Aug. 31, 2017, now Pat. No. 9,922,855, which is a continuation of application No. 14/860,045, filed on Sep. 21, 2015, now Pat. No. 9,779,974.

(60) Provisional application No. 62/182,896, filed on Jun. 22, 2015.

(51) Int. Cl.
| | |
|---|---|
| *H01L 21/00* | (2006.01) |
| *H01L 21/683* | (2006.01) |
| *G05D 23/19* | (2006.01) |
| *H01L 21/67* | (2006.01) |
| *H01L 21/66* | (2006.01) |

(52) U.S. Cl.
CPC ..... *H01L 21/6831* (2013.01); *G05D 23/1931* (2013.01); *H01L 21/67109* (2013.01); *H01L 21/67248* (2013.01); *H01L 22/20* (2013.01)

(58) Field of Classification Search
CPC ................. H01L 21/324; H01L 21/67248
See application file for complete search history.

(56) References Cited

U.S. PATENT DOCUMENTS

| | | |
|---|---|---|
| 5,475,610 A | 12/1995 | Atwood et al. |
| 5,667,622 A | 9/1997 | Hasegawa et al. |
| 5,810,933 A | 9/1998 | Mountsier et al. |
| 6,091,060 A | 7/2000 | Getchel et al. |

(Continued)

OTHER PUBLICATIONS

U.S. Appl. No. 14/860,045, filed Sep. 21, 2015.

(Continued)

*Primary Examiner* — Angel Roman (57) ABSTRACT

A temperature controller for a substrate processing system includes an interface configured to receive a processing temperature corresponding to a desired processing temperature of a substrate. The temperature controller includes a thermal control element controller configured to selectively control a thermal control element to adjust a temperature of a substrate support. The thermal control element controller is further configured to, prior to the substrate being loaded onto the substrate support, determine at least one of a temperature of the substrate support and a temperature of the substrate and, based on the processing temperature and the at least one of the temperature of the substrate support and the temperature of the substrate, control the thermal control element to adjust the temperature of the substrate support to a setpoint temperature that is different than the processing temperature.

20 Claims, 7 Drawing Sheets

(56) References Cited

U.S. PATENT DOCUMENTS

| | | |
|---|---|---|
| 6,259,072 B1 | 7/2001 | Kinnard et al. |
| 6,342,691 B1 | 1/2002 | Johnsgard et al. |
| 7,415,312 B2 | 8/2008 | Barnett, Jr. et al. |
| 7,952,049 B2 | 5/2011 | Tsukamoto |
| 8,461,674 B2 | 6/2013 | Gaff et al. |
| 8,546,732 B2 | 10/2013 | Singh |
| 8,587,113 B2 | 11/2013 | Gaff et al. |
| 8,624,168 B2 | 1/2014 | Gaff et al. |
| 8,637,794 B2 | 1/2014 | Singh et al. |
| 8,642,480 B2 | 2/2014 | Gaff et al. |
| 8,680,441 B2 | 3/2014 | Singh |
| 8,691,598 B1 | 4/2014 | McWhirter et al. |
| 8,755,204 B2 | 6/2014 | Benjamin |
| 8,791,392 B2 | 7/2014 | Singh |
| 8,809,747 B2 | 8/2014 | Pease et al. |
| 8,809,774 B2 | 8/2014 | Vertes et al. |
| 8,852,964 B2 | 10/2014 | Kimura et al. |
| 8,884,194 B2 | 11/2014 | Singh et al. |
| 9,123,755 B2 | 9/2015 | Swanson et al. |
| 9,779,974 B2 | 10/2017 | Zhang et al. |
| 2001/0019741 A1 | 9/2001 | Inaba et al. |
| 2002/0003037 A1 | 1/2002 | Cousineau et al. |
| 2002/0062954 A1 | 5/2002 | Getchel et al. |
| 2003/0155939 A1 | 8/2003 | Lutz et al. |
| 2003/0186545 A1 | 10/2003 | Kamp et al. |
| 2004/0012404 A1 | 1/2004 | Feder et al. |
| 2006/0084188 A1 | 4/2006 | You et al. |
| 2007/0251456 A1 | 11/2007 | Herchen et al. |
| 2008/0023656 A1 | 1/2008 | Quach et al. |
| 2008/0142500 A1 | 6/2008 | Tomita et al. |
| 2008/0170969 A1 | 7/2008 | Yoshioka et al. |
| 2009/0008381 A1 | 1/2009 | Jyousaka et al. |
| 2010/0332013 A1 | 12/2010 | Choi et al. |
| 2011/0143462 A1 | 6/2011 | Gaff et al. |
| 2011/0186545 A1 | 8/2011 | Mahadeswaraswamy et al. |
| 2014/0073066 A1 | 3/2014 | Tabuchi |
| 2014/0154819 A1 | 6/2014 | Gaff et al. |
| 2014/0166632 A1 | 6/2014 | McWhirter et al. |
| 2014/0220709 A1 | 8/2014 | Kimura et al. |
| 2015/0060013 A1 | 3/2015 | Buchberger, Jr. |
| 2015/0132863 A1 | 5/2015 | Oohashi |
| 2015/0170917 A1 | 6/2015 | Ho et al. |
| 2015/0176928 A1 | 6/2015 | Tabuchi |
| 2016/0086818 A1 | 3/2016 | Hamano et al. |
| 2016/0225645 A1 | 8/2016 | Koizumi et al. |
| 2016/0370788 A1 | 12/2016 | Bailey, III et al. |
| 2017/0133251 A1 | 5/2017 | Wu et al. |
| 2017/0215230 A1* | 7/2017 | Parkhe ................ H05B 1/0233 |

OTHER PUBLICATIONS

U.S. Appl. No. 15/692,002, filed Aug. 31, 2017.
U.S. Appl. No. 14/860,045, filed Sep. 21, 2015, Tao Zhang et al.
U.S. Appl. No. 14/860,078, filed Sep. 21, 2015, Marcus Musselman et al.
U.S. Appl. No. 14/860,009, filed Sep. 21, 2015, Marcus Musselman et al.
U.S. Appl. No. 14/859,951, filed Sep. 21, 2015, Benny Wu et al.
U.S. Appl. No. 14/862,789, filed Sep. 23, 2015, Andrew D. Bailey, III et al.

* cited by examiner

REDUCING TEMPERATURE TRANSITION IN A SUBSTRATE SUPPORT

CROSS-REFERENCE TO RELATED APPLICATIONS

The present disclosure is a continuation of U.S. patent application Ser. No. 15/692,002, filed on Aug. 31, 2017, which is a continuation of U.S. patent application Ser. No. 14/860,045, filed on Sep. 21, 2015, which claims the benefit of U.S. Provisional Application No. 62/182,896, filed on Jun. 22, 2015. The entire disclosures of the applications referenced above are incorporated herein by reference.

FIELD

The present disclosure relates to substrate processing systems, and more particularly to systems and methods for controlling the temperature of a substrate support device in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, lithography, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch, deposition, and cleaning processes. A substrate may be arranged on a pedestal, an electrostatic chuck (ESC), etc. in a processing chamber of the substrate processing system. For example, during an etch or deposition process, such as a PECVD process, a gas mixture including one or more precursors is introduced into the processing chamber and plasma is struck to etch the substrate.

During process steps, temperatures of various components of the system, and the substrate itself, may vary. These temperature variations may have undesirable effects on the resulting substrates (e.g., non-uniform critical dimensions). Accordingly, substrate processing systems may implement various systems and methods for controlling temperatures of various components and the substrates during processing.

SUMMARY

This section provides a general summary of the disclosure, and is not a comprehensive disclosure of its full scope or all of its features.

According to one aspect, the present disclosure provides a system for controlling a substrate temperature in a substrate processing system. The system for controlling the substrate temperature includes a substrate support device, a controller, a temperature sensor, and a thermal control element (TCE). The substrate support device is configured to support the substrate. The temperature sensor is configured to sense a temperature of the substrate support device. The TCE is configured to selectively heat the substrate support device. The controller is configured to determine a temperature difference between the substrate temperature before the substrate is loaded onto the substrate support device and a desired temperature for the substrate support device. The controller is further configured to, during a first period, control the TCE to adjust the temperature of the substrate support device to a temperature value based on the temperature difference. The temperature value is not equal to the desired temperature for the substrate support device. The substrate may be loaded onto the substrate support device after the first period begins and before the temperature of the substrate support device returns to the desired temperature. The controller is further configured to, during a second period that follows the first period, control the temperature of the substrate support device to the desired temperature for the substrate support device.

In some configurations, the temperature value is greater than the desired temperature for the substrate support device.

In some configurations, the temperature value is less than the desired temperature for the substrate support device.

In some configurations, the temperature difference includes a first temperature difference corresponding to a first substrate, and a second temperature difference corresponding to a second substrate.

In some configurations, the system includes a memory that stores at least one of the first and second temperature differences.

In some configurations, the controller is configured to control the TCE based at least in part on the first and second temperature differences.

In some configurations, the controller is configured to control the TCE based on the second temperature difference offset by the first temperature difference.

In some configurations, control of the TCE corresponding to the second substrate is determined based on control of the TCE corresponding to the first substrate.

In some configurations, the controller is configured to determine a third temperature difference corresponding to a third substrate, and the controller is further configured to control the TCE based on the third temperature difference offset by at least one of the first and second temperature differences.

In some configurations, the controller is configured to determine the third temperature difference after the first and second substrates are loaded on the substrate support device.

In some configurations, the controller is configured to control the TCE based on the first temperature difference prior to the second substrate being loaded on the substrate support device.

In some configurations, control of the TCE includes control of at least one of a power and a cycle time of the TCE.

In some configurations, the TCE is arranged within a heating plate of the substrate support device.

In some configurations, the substrate support device includes an electrostatic chuck.

In some configurations, the substrate is configured to reduce the temperature of the substrate support device from the temperature value to the desired temperature during the second period.

In some configurations, the substrate is configured to increase the temperature of the substrate support device from the temperature value to the desired temperature during the second period.

In some configurations, the system includes a sensor configured to measure a temperature of the substrate prior to the first period.

In some configurations, the TCE is one of a macro TCE and a micro TCE.

According to another aspect, the present disclosure provides a method for controlling a substrate temperature in a substrate processing system. The method includes determining a temperature difference between the substrate temperature before the substrate is loaded onto a substrate support device and a desired temperature for the substrate support device. The method also includes, during a first period, controlling the TCE to adjust the temperature of the substrate support device to a temperature value based on the temperature difference. The temperature value is not equal to the desired temperature for the substrate support device. The method further includes loading the substrate onto the substrate support device after the first period begins and before the temperature of the substrate support device returns to the desired temperature. The method also includes, during a second period that follows the first period, controlling the temperature of the substrate support device to the desired temperature for the substrate support device.

In some configurations, the method includes storing at least one of the first temperature difference and the second temperature difference in a memory.

In some configurations, the method includes controlling the TCE to adjust the temperature of the substrate support device to the temperature value based at least in part on the first and second temperature differences.

In some configurations, the method includes controlling the TCE based on the second temperature difference offset by the first temperature difference.

In some configurations, the method includes controlling the TCE corresponding to the second substrate based on controlling the TCE corresponding to the first substrate.

In some configurations, the method includes determining a third temperature difference between the desired temperature for the substrate support device and a substrate temperature of a third substrate after the first and second substrates are loaded on the substrate support device.

In some configurations, the method includes controlling the TCE based on the third temperature difference offset by at least one of the first and second temperature differences.

In some configurations, the method includes controlling, with the substrate, the temperature of the substrate support device from the temperature value to the desired temperature during the second period.

In some configurations, the method includes measuring a temperature of the substrate prior to the first period.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In a substrate processing system, a substrate may be arranged on a platen or substrate support device, such as a pedestal or a clamping device such as an electrostatic chuck (ESC), for example, for processing. Different processes and respective steps may require that the substrate be maintained at different temperatures. Accordingly, a temperature of the ESC may be controlled prior to processing the substrate in the substrate processing system. In particular, a contact surface temperature of the ESC may be controlled or changed prior to arranging or clamping the substrate on the ESC in order to ensure that the processes and respective steps take place at a predetermined temperature. For example only, the ESC may include a heating plate (e.g., a ceramic heating plate). The substrate may be arranged on the heating plate. Accordingly, the temperature of the heating plate is controlled to achieve the desired temperatures of the substrate.

In systems and methods for controlling the temperature of an electrostatic chuck in a substrate processing system according to the principles of the present disclosure, an ESC including multiple zones (e.g., a multi-zone ESC) may include one or more temperature control elements (TCEs). The TCEs may include heating elements. In some configurations, the ESC includes respective macro TCEs for each zone of a heating plate and a plurality of micro TCEs distributed throughout the heating plate.

In system and methods according to the principles of the present disclosure, the TCEs may be individually or collectively controlled to compensate for differences between a desired processing temperature(s) and a temperature of the ESC and/or the substrate. In particular, the TCEs may be controlled prior to arranging a substrate on the ESC. In some configurations, controlling the TCEs may correspond to preheating the ESC. In other configurations, controlling the TCEs may correspond to precooling the ESC. The desired processing temperature may correspond to a predetermined setpoint temperature at which a substrate is processed (e.g., etched, cleaned, deposition, lithography, etc.). For example, if the temperature of the substrate is lower than the desired processing temperature, the TCEs may be controlled to heat the ESC prior to arranging the substrate on the ESC. Accordingly, after the substrate is arranged on the ESC, the temperature of the substrate is increased, and the temperature of the ESC is reduced, such that the temperatures of the substrate and ESC are equal to the desired processing temperature. Similarly, if the temperature of the substrate is higher than the desired processing temperature, the TCEs may be controlled to allow the ESC to cool prior to arranging the substrate on the ESC. Accordingly, after the substrate is arranged on the ESC, the temperature of the substrate is reduced, and the temperature of the ESC is increased, such that the temperatures of the substrate and ESC are equal to the desired processing temperature. Controlling the temperature of the TCEs, and thus the ESC, prior to arranging the substrate on the ESC reduces the amount of time required for the temperature of the substrate and the ESC to reach the desired processing temperature. Accordingly, controlling the temperature of the TCEs, and thus the ESC, prior to arranging the substrate on the ESC, increases the throughput of the substrate processing system.

In some configurations, the systems and methods for controlling the temperature of an electrostatic chuck in a substrate processing system according to the principles of the present disclosure include a closed-loop system. In this regard, control of the TCEs for a substrate (n) may be adjusted according to the control of the TCEs for a prior substrate(s) (n−1, n−2, etc.). In particular, the systems and methods according to the principles of the present disclosure may learn from the control of the TCEs for the prior substrate(s) and adjust the control of the TCEs for subsequent substrates accordingly.

Figure 1:
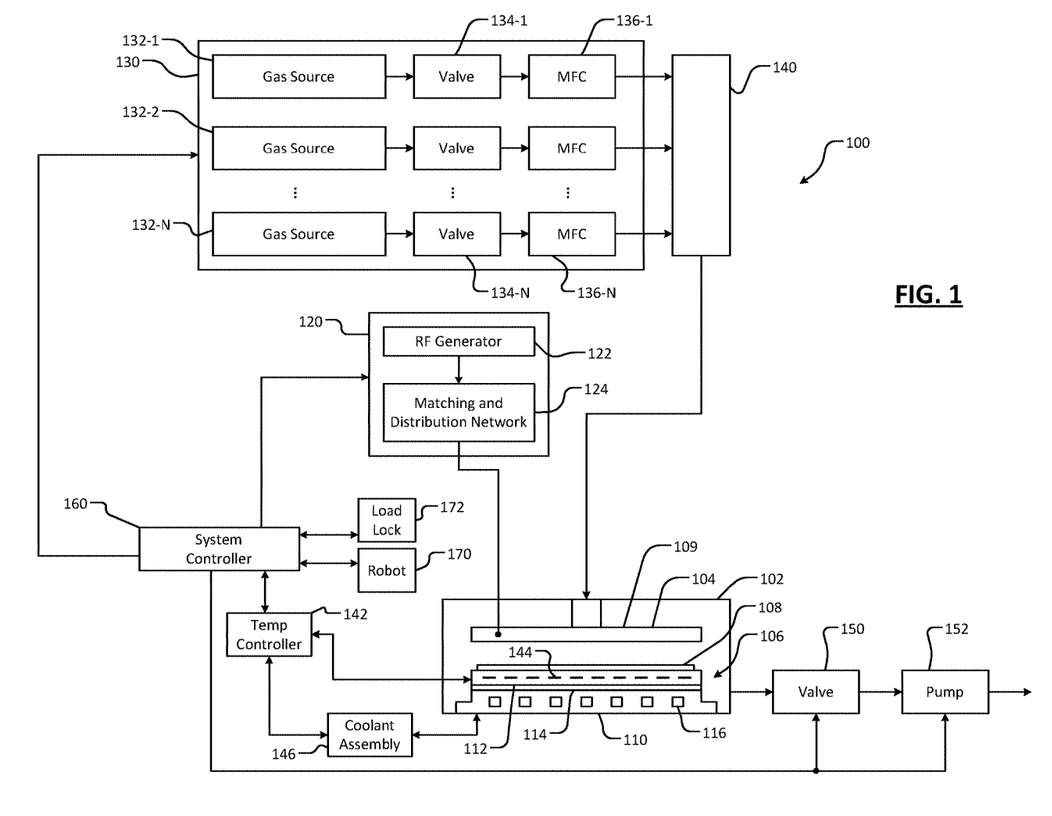
FIG. 1 is a functional block diagram of an example substrate processing system including an electrostatic chuck according to the principles of the present disclosure.

Referring now to FIG. 1, an example substrate processing system 100 for performing etching using RF plasma is shown. The substrate processing system 100 includes a processing chamber 102 that encloses other components of the substrate processing system 100 and contains the RF plasma. The substrate processing chamber 100 includes an upper electrode 104 and an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108. For example, the temperature controller 142 may be used to control the plurality of TCEs 144 prior to arranging the substrate 108 on the ESC 106. In some configurations, the temperature controller 142 may control the plurality of TCEs 144 prior to arranging a first substrate on the ESC 106, and may also control the plurality of TCEs 144 prior to arranging a second substrate on the ESC 106 subsequent to the first substrate. In particular, control of the plurality of TCEs 144 prior to arranging the second substrate on the ESC 106 may be adjusted by the control of the plurality of TCEs 144 prior to arranging the first substrate on the ESC 106.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172.

Figure 2A:
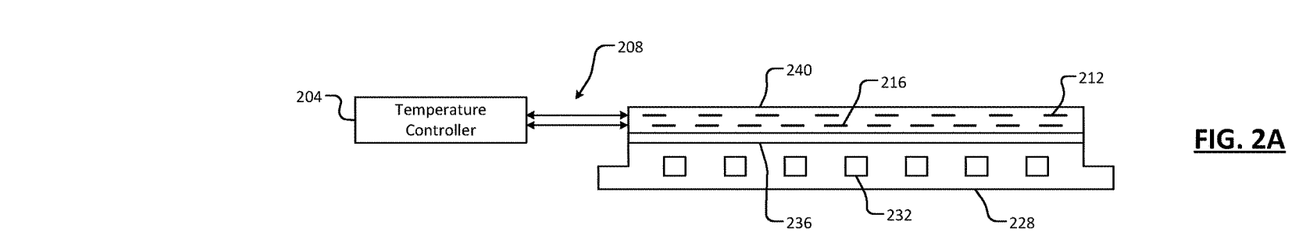
FIG. 2A is an example electrostatic chuck according to the principles of the present disclosure.
Figure 2B:
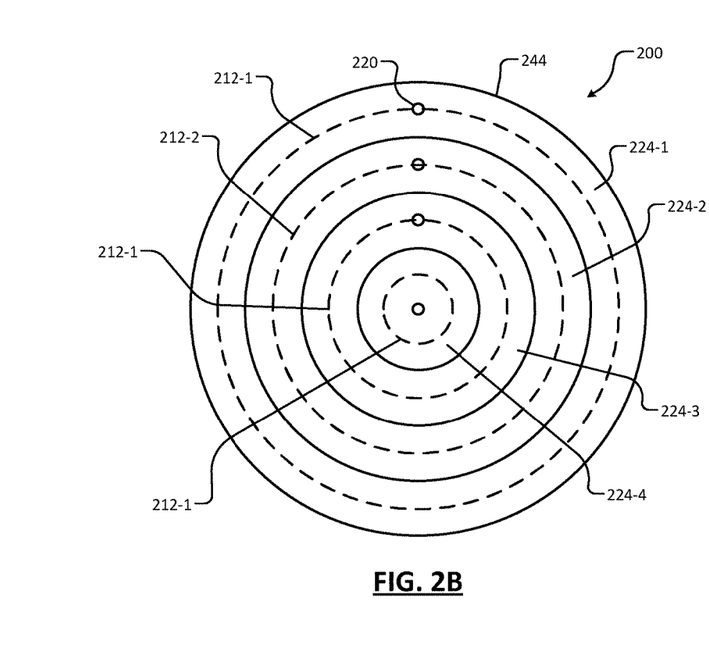
FIG. 2B illustrates zones and macro thermal control elements of an example electrostatic chuck according to the principles of the present disclosure.
Figure 2C:
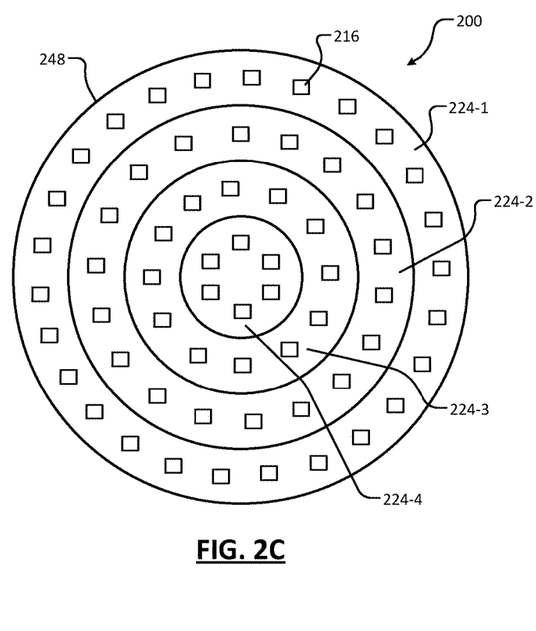
FIG. 2C illustrates zones and micro thermal control elements of an example electrostatic chuck according to the principles of the present disclosure.

Referring now to FIGS. 2A, 2B, and 2C, an example ESC 200 is shown. A temperature controller 204 communicates with the ESC 200 via one or more electrical connections 208. For example, the electrical connections 208 may include, but are not limited to, connections for selectively controlling macro TCEs 212-1, 212-2, 212-3, and 212-4, referred to collectively as macro TCEs 212, and/or micro TCEs 216 and connections for receiving temperature feedback from one or more zone temperature sensors 220.

As shown, the ESC 200 is a multi-zone ESC including zones 224-1, 224-2, 224-3, and 224-4, referred to collectively as zones 224. Although shown with the four concentric zones 224, in embodiments the ESC 200 may include one, two, three, or more than four of the zones 224. Each of the zones 224 includes at least one of the zone temperature sensors 220 and a respective one of the macro TCEs 212. For example, the ESC 200 includes a baseplate 228 including coolant channels 232, a thermal resistance layer 236 formed on the baseplate 228, and a multi-zone ceramic heating plate 240 formed on the thermal resistance layer 236. The heating plate 240 may include multiple bonded layers, including a first layer 244 as shown in FIG. 2B and a second layer 248 as shown in FIG. 2C. The first layer 244 includes the macro TCEs 212 and the second layer 248 includes the plurality of micro TCEs 216. As shown, the macro TCEs 212 and the first layer 244 are shown arranged above the micro TCEs 216 and the second layer 248. In some embodiments, the macro TCEs 212 and the first layer 244 may be arranged below the micro TCEs 216 and the second layer 248.

The temperature controller 204 controls the macro TCEs 212 and the micro TCEs 216 according to a desired setpoint temperature. For example, the temperature controller 204 may receive (e.g., from the system controller 160 as shown in FIG. 1) a setpoint temperature for one or more of the zones 224. For example only, the temperature controller 204 may receive a same setpoint temperature for all or some of the zones 224 and/or different respective setpoint temperatures for each of the zones 224. The setpoint temperatures for each of the zones 224 may vary across different processes and different steps of each process.

The temperature controller 204 controls the macro TCEs 212 for each of the zones 224 based on the respective setpoint temperatures and temperature feedback provided by the sensors 220. For example, the temperature controller 204 individually adjusts power (e.g., current) provided to each of the macro TCEs 212 to achieve the setpoint temperatures at each of the sensors 220. The macro TCEs 212 may each include a single resistive coil or other structure schematically represented by the dashed lines of FIG. 2B. Accordingly, adjusting one of the macro TCEs 212 affects the temperature of the entire respective zone 224. The sensors 220 may provide temperature feedback for only a local portion of each of the zones 224. For example only, the sensors 220 may be positioned in a portion of each zone 224 previously determined to have a closest correlation to an average temperature of the zone 224.

Conversely, the temperature controller 204 may individually control each of the micro TCEs 216 to locally adjust temperatures of the zones 224. For example, although each micro TCE 216 may be located entirely within one of the zones 224, adjusting a thermal output of any one of the micro TCEs 216 may have a thermal impact across multiple zones 224 and localities of the heating plate 240. Accordingly, one or more of the micro TCEs 216 may be selectively activated and/or deactivated to further adjust temperatures of the zones 224.

In systems and methods for transitioning or controlling a change in the temperature of an ESC (e.g., the ESC 200) and/or the temperature of the ESC and a substrate (e.g., substrate 108) according to the principles of the present disclosure, the temperature controller 204 selectively activates one or more TCEs (e.g., micro TCEs 216 and/or macro TCEs 212) prior to arranging the substrate on the ESC to compensate for differences between the actual temperature of the substrate and the desired temperature of the substrate. In particular, according to the principles of the present disclosure, prior to arranging the substrate on the ESC, the contact surface temperature of the ESC may be controlled by selectively activating one or more TCEs to increase or reduce the amount of heat provided to the ESC in order to either heat or cool the ESC. By selectively heating and/or cooling the ESC prior to arranging the substrate on the ESC, the throughput of a substrate processing system (e.g., the substrate processing system 100) can be increased. In particular, the amount of time needed to reach a predetermined temperature of the substrate, before processing steps are performed on the substrate, is reduced.

Figure 3:
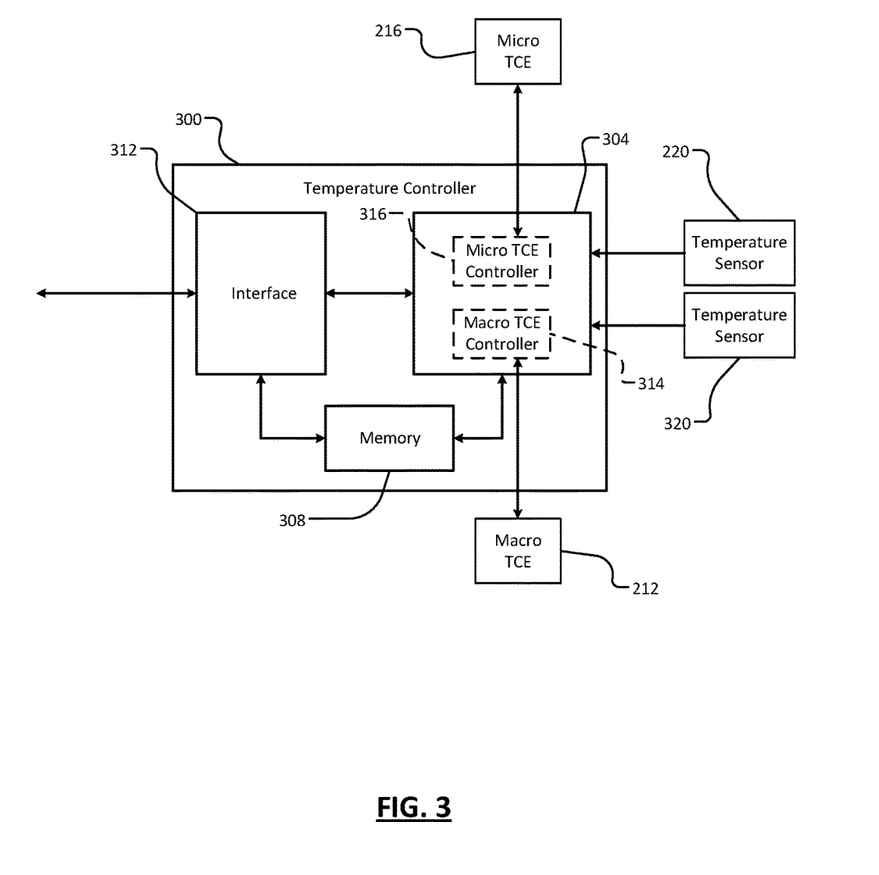
FIG. 3 is an example temperature controller for an electrostatic chuck according to the principles of the present disclosure.

Referring now to FIG. 3, and with reference to FIGS. 2A, 2B, and 2C, an example implementation of a temperature controller 300 is illustrated. The temperature controller includes a TCE controller 304, memory 308, and an interface 312 for communicating with, for example, the system controller 160 as shown in FIG. 1. For example, the temperature controller 300 receives a processing temperature from the system controller 160 via the interface 312. The processing temperature may correspond to a predetermined or desired setpoint temperature at which processing takes place. In this regard, the processing temperature may include more than one processing temperature value, such that each processing temperature value corresponds to a different processing step. The processing temperature may further include a single processing temperature for every zone 224 and/or different processing temperatures for each of the respective zones 224. In this regard, the processing temperature may correspond to a temperature received from a user of the substrate processing system, and/or automatically generated by the substrate processing system while performing a process. The interface 312 provides the processing temperature to the TCE controller 304.

In some configurations, the TCE controller 304 includes a macro TCE controller 314 and a micro TCE controller 316. The macro TCE controller 314 controls the macro TCEs 212 according to the received processing temperature(s). For example, the macro TCE controller 314 may adjust each macro TCE 212 to the corresponding processing temperature(s). In particular, the TCE controller 314 may adjust each macro TCE 212 until the temperature in each zone 224 approaches the processing temperature(s). The micro TCEs 216 can then be controlled to achieve the processing temperature(s) throughout the zone 224, thereby compensating for temperature non-uniformities in the zone 224. For example, some of the micro TCEs 216 may be controlled to increase the temperature in a portion of the zone 224 by a first value, and others of the micro TCEs 216 may be controlled to increase the temperature in another portion of the zone 224 by a second value that is higher or lower than the first value.

One or more of the sensors 220 may provide temperature feedback to the TCE controller 304 corresponding to a temperature of the ESC (e.g., ESC 200). For example, the temperature feedback provided by the sensors 220 may include a temperature(s) of one or more of the zones 224. As will be explained in more detail, below, the temperature of the ESC may be sensed and provided to the TCE controller 304 before or after arranging a substrate (e.g., substrate 108) on the ESC.

One or more sensors 320 may provide temperature feedback to the TCE controller 314 corresponding to a temperature of the substrate. The temperature feedback provided by the sensors 320 may be sensed and provided to the TCE controller 304 before arranging the substrate on the ESC.

The memory 308 may include non-volatile memory such as flash memory, for example. Temperature feedback from the sensors 220 and the sensors 320 is stored in the memory 308. The memory 308 may also store other characteristics relevant to processing the substrate in the system 100, such as a predetermined or threshold processing temperatures, and a heat capacity constant for the substrate, for example. Moreover, as will be explained in more detail below, the memory 308 may store previously determined power profiles (e.g., current draw, cycle time that elapses for a current draw, etc.) of each of the macro and/or micro TCEs 212, 216. In particular, the memory 308 may store the temperature feedback, processing characteristics, and/or previously determined power profiles for use prior to processing subsequent substrates. For example, the TCE controller 314 may access and use the power profile corresponding to previously-processed substrate(s) for determining the power profile of subsequent substrate(s).

Figure 4:
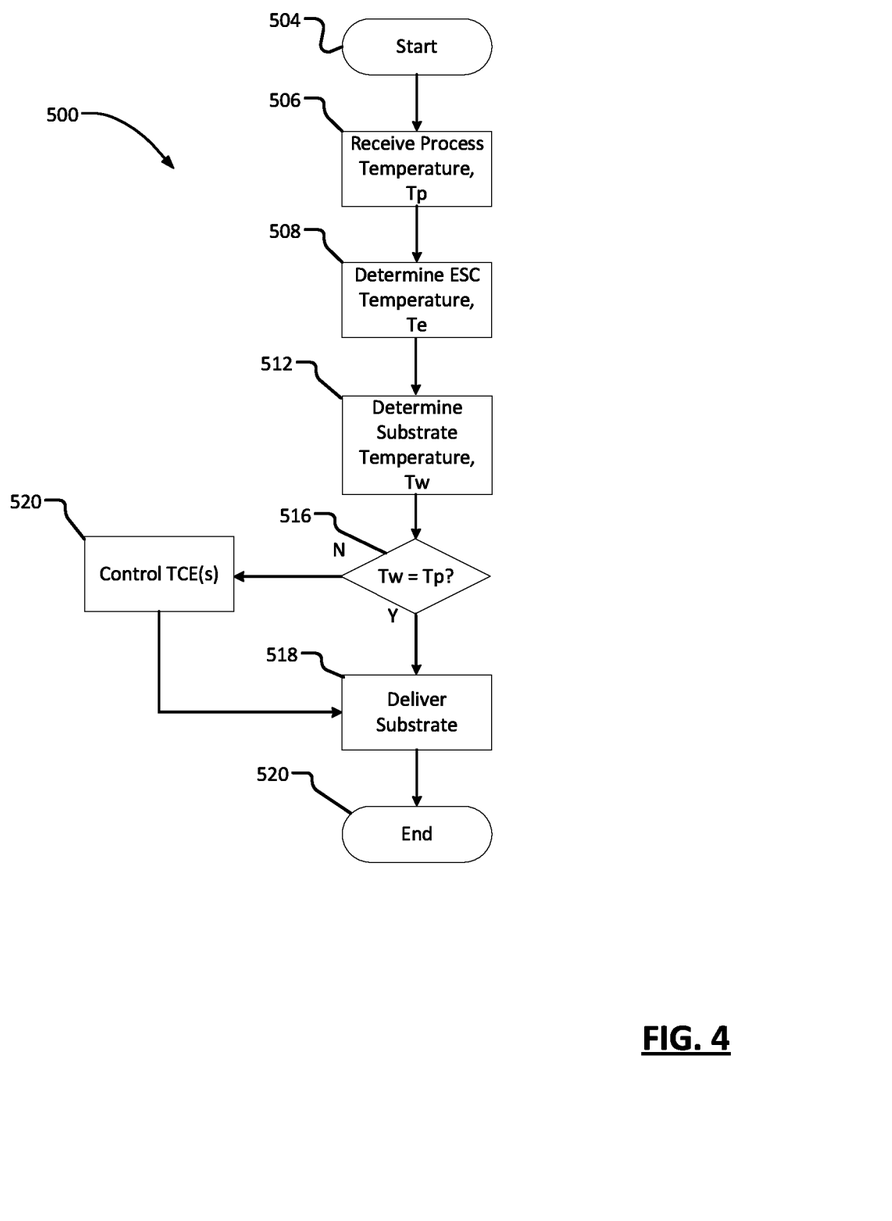
FIG. 4 illustrates an example method for controlling the temperature of an electrostatic chuck in a substrate processing system according to the principles of the present disclosure.

Referring now to FIG. 4, an example method 500 for controlling the temperature of an ESC in a substrate processing system begins at 504. As will be explained in more detail below, the method 500 may begin prior to processing a substrate. In some configurations, the method 500 begins prior to arranging the substrate on the ESC.

At 506, a temperature controller receives a desired processing temperature or temperatures for a respective substrate. For example, in some configurations, a user may send the desired processing temperature to the temperature controller (e.g., temperature controller 300) through an interface (e.g., interface 312). In other configurations, the temperature controller may retrieve the desired processing temperature from memory.

At 508, the temperature controller determines the temperature of the ESC. For example, the temperature controller may receive the temperature of the ESC from one or more temperature sensors (e.g., sensor 220).

At 512, the method 500 determines the temperature of the substrate. For example, the temperature controller may receive the temperature of the substrate from one or more temperature sensors (e.g., sensor 320). At 516, the temperature controller determines whether the substrate temperature is equal to the desired processing temperature. If the method determines at 516 that the substrate temperature is equal to the desired processing temperature, the method 500 continues to 518. If the method 500 determines at 516 that the substrate temperature is not equal to the desired processing temperature, the method 500 continues to 520 where the temperature controller and/or the TCE controller controls one or more TCEs (e.g., macro TCEs 212 and/or micro TCEs 216).

If the method 500 determines at 516 that the substrate temperature is less than the desired processing temperature, the TCE controller controls one or more TCEs to add a predetermined amount of heat to, and increase the temperature of, the ESC. In particular, the TCE controller may activate one or more TCEs to a predetermined power level and/or for a predetermined amount of time to add the predetermined amount of heat to the ESC, such that the temperature of the ESC exceeds the desired processing temperature prior to delivering the substrate to the ESC. The TCE controller may calculate the amount of heat energy that will cause the substrate temperature to equal the temperature of the ESC. For example, the TCE controller may retrieve the heat capacity constant for the substrate from memory (e.g., memory 308) and multiply the heat capacity constant by the difference between the substrate temperature and the desired processing temperature to calculate the amount of heat energy that will cause the substrate temperature to equal the temperature of the ESC. In particular, the TCE controller may add an amount of heat energy "Q" to the substrate according to the following equation, where "C" is the heat capacity constant for the substrate, $T_W$ is the desired processing temperature, and $T_{W0}$ is the substrate temperature:

$$Q = C \times (T_W - T_{W0})$$

If the method determines at 516 that the substrate temperature is greater than the desired processing temperature, the TCE controller controls one or more TCEs to remove a predetermined amount of heat from, and decrease the temperature of, the ESC. In some configurations, the TCE controller may deactivate one or more of the TCEs, or reduce the power sent to one or more of the TCEs, for a predetermined amount of time until the predetermined amount of heat is removed from the ESC, such that the temperature of the ESC is lower than the desired processing temperature prior to delivering the substrate to the ESC. In other configurations, where one or more of the TCEs includes a Peltier element, or similar device, the TCE controller may activate one or more of the TCEs, or increase the power sent to one or more of the TCEs, for a predetermined amount of time until the predetermined amount of heat is removed from the ESC, such that the temperature of the ESC is lower than the desired processing temperature prior to delivering the substrate to the ESC.

At 518, the substrate is arranged on the ESC prior to processing in the substrate processing system. In particular, at 518 the substrate may be clamped to the ESC. Where the substrate temperature is greater than the desired processing temperature, the temperature of the substrate support device may thereafter increase, and the temperature of the substrate may thereafter be reduced, to the desired temperature. Conversely, where the substrate temperature is less than the desired processing temperature, the temperature of the substrate support device may thereafter be reduced, and the temperature of the substrate may thereafter increase, to the desired temperature. The method ends at 522.

Figure 5:
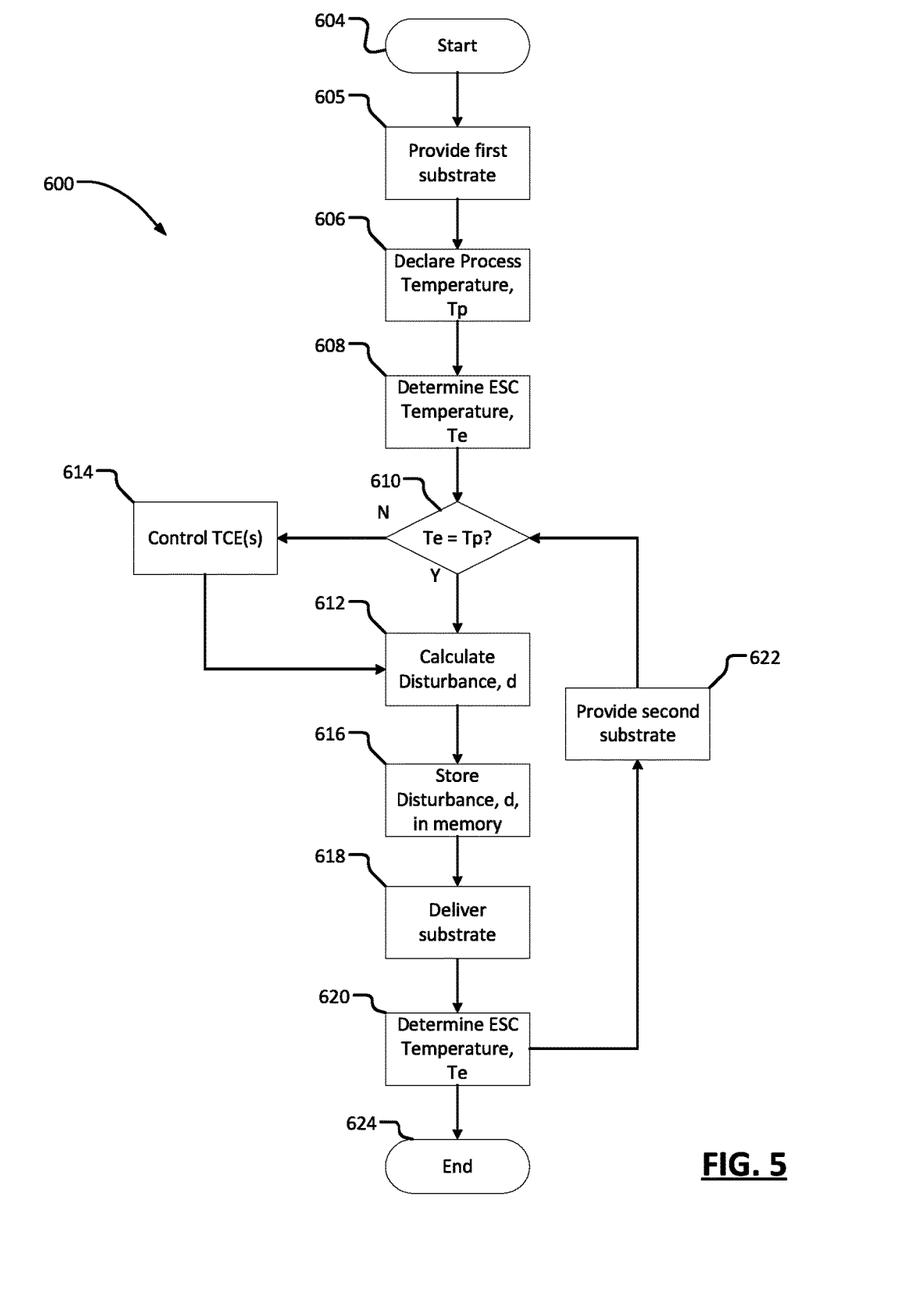
FIG. 5 illustrates another example method for controlling the temperature of an electrostatic chuck in a substrate processing system according to the principles of the present disclosure.

Referring now to FIG. 5, another example method 600 for controlling the temperature of an ESC in a substrate processing system begins at 604. The method 600 may be substantially similar to the method 500, except as otherwise provided herein. In this regard, the method 600 may be implemented by a temperature controller or control system, such as the temperature controller 300 illustrated in FIG. 3. At least a portion of the method 600 may occur prior to processing a substrate. In some configurations, at least a portion of the method 600 occurs prior to arranging the substrate on the ESC.

At 605, a first substrate is presented for processing in the substrate processing system. At 606, the temperature controller declares a desired processing temperature or temperatures for the substrate. For example, in some configurations, a user may send the desired processing temperature to the temperature controller through an interface (e.g., interface 312 in FIG. 3). In other configurations, the temperature controller may retrieve the desired processing temperature from memory (e.g., memory 308 in FIG. 3).

At 608, the temperature controller determines a first temperature of the ESC. For example, in some configurations the temperature controller may receive the temperature of the ESC from one or more temperature sensors (e.g., sensor 220). In other configurations, the temperature controller may retrieve the first temperature of the ESC from memory.

At 610, the temperature controller determines whether the first temperature of ESC is equal to the desired processing temperature. If the method 600 determines at 610 that the first temperature of the ESC is equal to the desired processing temperature, the method 600 continues to 612. If the method 600 determines at 610 that the first temperature of the ESC is not equal to the desired processing temperature, the method 600 continues to 614 where the temperature controller including a TCE controller (e.g., TCE controller 304 in FIG. 3), controls one or more TCEs (e.g., macro TCEs 212 and/or micro TCEs 216). For example, if the first temperature of the ESC is less than the desired processing temperature, the temperature controller controls one or more TCEs to add a predetermined amount of heat to, and increase the temperature of, the ESC. In particular, the temperature controller may activate one or more TCEs to a predetermined power level and/or for a predetermined amount of time to add the predetermined amount of heat to the ESC. If the method determines at 610 that the first temperature of the ESC is greater than the desired processing temperature, the temperature controller controls one or more TCEs to remove a predetermined amount of heat from, and decrease the temperature of, the ESC. For example, the temperature controller may deactivate one or more of the TCEs, or reduce the power sent to one or more of the TCEs, for a predetermined amount of time until the predetermined amount of heat is removed from the ESC.

At 612, the temperature controller determines a temperature disturbance created by the substrate relative to the ESC. In this regard, the disturbance may be caused by clamping the substrate, having a substrate temperature, to the ESC having the first temperature, where the first temperature of the ESC does not equal the substrate temperature. In particular, the disturbance "d" caused by clamping the substrate to the ESC may be determined according to the following equation, where "u" is the predetermined amount of heat added to or removed from the TCEs, "y" is the temperature of the ESC, and "G" is the transfer function for the temperature controller:

$$d = \frac{y}{G} - u$$

The value of the temperature disturbance can be stored in memory (e.g., memory 308 in FIG. 3) at 616.

At 618, the substrate is arranged on the ESC prior to processing in the substrate processing system. In particular, at 618 the substrate may be clamped to the ESC. Where the substrate temperature is greater than the desired processing temperature, the temperature of the substrate support device may thereafter increase, and the temperature of the substrate may thereafter be reduced, to the desired temperature. Conversely, where the substrate temperature is less than the desired processing temperature, the temperature of the substrate support device may thereafter be reduced, and the temperature of the substrate may thereafter increase, to the desired temperature.

At 620, the temperature controller determines a second temperature of the ESC. For example, the temperature controller may receive the second temperature of the ESC from one or more temperature sensors (e.g., sensor 220). The second temperature of the ESC may correspond to the temperature of the ESC after the first substrate has been clamped to the ESC.

At 622, a second substrate may be provided to the substrate processing system for processing. Upon providing the second substrate for processing, the method 600 returns to 610 where the temperature controller determines whether the second temperature of the ESC, determined at 620, is equal to the desired processing temperature. If the method determines at 610 that the second temperature of the ESC is equal to the desired processing temperature, the method 600 continues to 612, where the temperature controller determines a disturbance for the second substrate.

If the method determines at 610 that the second temperature of the ESC is not equal to the desired processing temperature, the method 600 continues to 614 where the temperature controller controls one or more of the TCEs. Control at 614 may be similar to control at 614 described above, except as otherwise provided herein. With respect to the second substrate, at 614 the temperature controller may offset the control of the TCE, such as the predetermined amount of heat, by the disturbance calculated with respect to the first substrate at 612. For example, with respect to the second substrate, at 614 the temperature controller may retrieve from memory the disturbance stored with respect to the first substrate at 616. In this way, for each successive substrate processed in the substrate processing system, the method 600 accounts for, and learns from, the determinations (e.g., determination of disturbance and/or determination of the predetermined amount of heat) for previous substrates. In particular, with respect to a second or subsequent substrate, the TCE controller may adjust the control of the TCE, and thus adjust the amount of heat energy "Q" added to or removed from the ESC by a learning "LG." For example, control "Ud(k)" of the TCE with respect to the second or subsequent substrate "k", may be calculated according to the following equation, where "UD(k−1)" is a vector applied to control the TCE with respect to the first or prior substrate "k−1", and "LG" is the learning gain relative to the first or prior substrate:

$$Ud(k) = Ud(k-1) + LG \times d$$

While control at 622 is described as providing a second substrate, control at 622 can include any number of successive substrates processed in the substrate processing system. For example, the method 600 may include three or more iterations of determining a disturbance value (e.g., control at 612) and/or determining a predetermined amount of heat (e.g., control at 614), with respect to three or more respective substrates. The method ends at 624.

Figure 6:
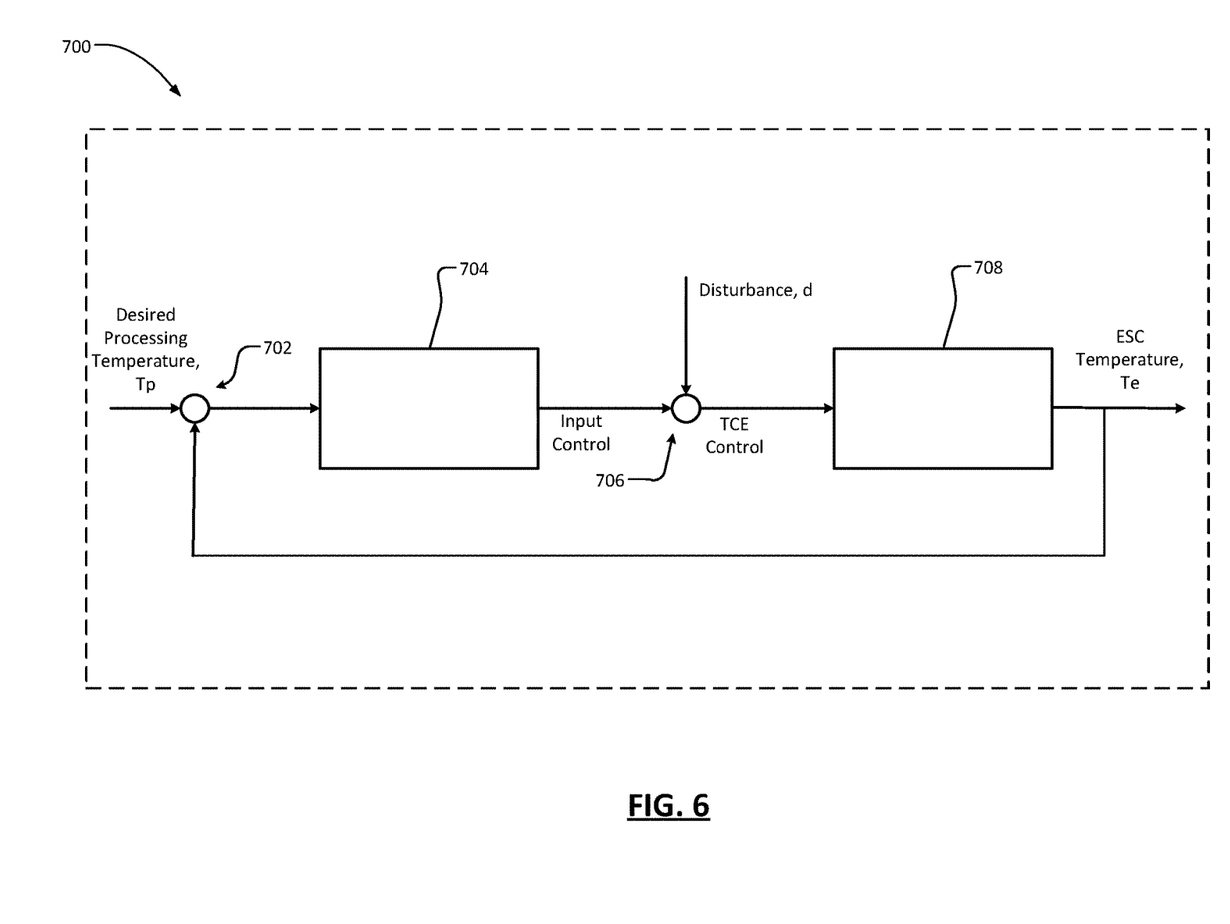
FIG. 6 is an example temperature control system for an electrostatic chuck according to the principles of the present disclosure.

Referring now to FIG. 6, an example temperature control system 700 according to the principles of the present disclosure is illustrated. The temperature control system 700 may be implemented by the temperature controller 300 illustrated in FIG. 3. The temperature control system 700 may include a comparator 702 that determines a difference between a desired processing temperature and a temperature of the ESC. The comparator 702 may output the difference between the desired processing temperature and the temperature of the ESC to a control block 704.

The control block 704 may determine an input control value for one or more TCEs (e.g., macro TCEs 212 and/or micro TCEs 216 in FIG. 3) and send the input control value to a control node 706. The control node 706 may determine a TCE control value by combining the input control value with a disturbance value (e.g., disturbance "d" determined in FIG. 5). The control node 706 may output the TCE control value to a TCE controller 708. For example, the control node 706 may control one or more TCEs to add a predetermined amount of heat to, and increase the temperature of, the ESC. Similarly, the control node 706 may control one or more TCEs to remove a predetermined amount of heat from, and decrease the temperature of, the ESC.

Figure 7:
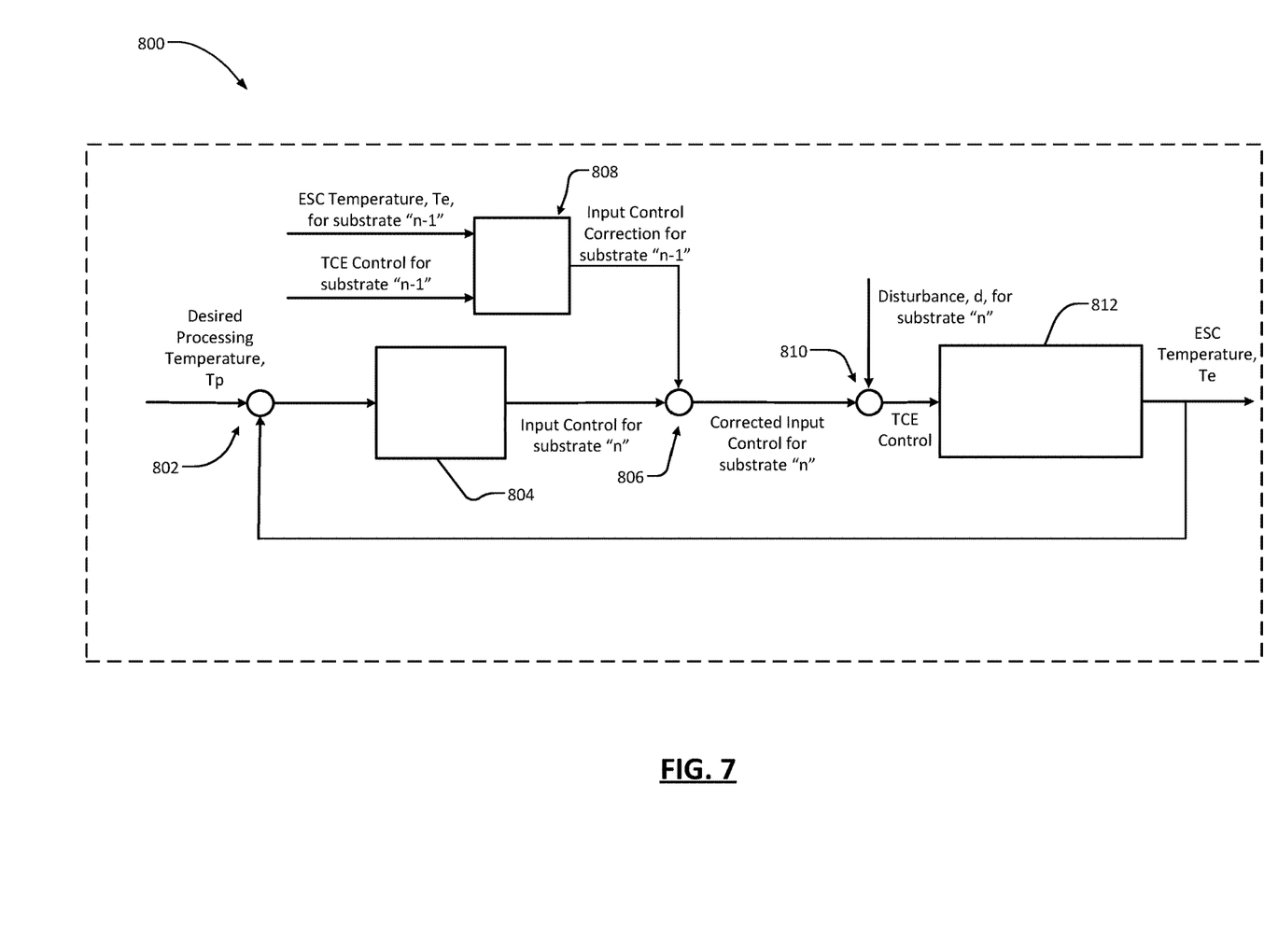
FIG. 7 is another example temperature control system for an electrostatic chuck according to the principles of the present disclosure.

Referring now to FIG. 7, another example temperature control system 800 according to the principles of the present disclosure is illustrated. The temperature control system 800 may be implemented by the temperature controller 300 illustrated in FIG. 3. The temperature control system 800 may include a comparator 802 that determines a difference between a desired processing temperature and a temperature of the ESC. The comparator 802 may output the difference between the desired processing temperature and the temperature of the ESC to a control block 804.

The control block 804 may determine an input control value for one or more TCEs (e.g., macro TCEs 212 and/or micro TCEs 216 in FIG. 3) and send the input control to a control node 806. The input control value may correspond to a substrate "n." The control node 806 corrects the input control by combining the input control value with an input control correction value determined by a control block 808. In this regard, the control block 808 may determine the input control correction value based on the ESC temperature and the input control for a substrate "n−1." The control node 806 outputs a corrected input control value for the substrate "n" to a control node 810.

The control node 810 determines a TCE control value by combining the corrected input control value with a disturbance value for the substrate "n" (e.g., disturbance "d" determined in FIG. 5). The control node 810 may output the TCE control value to a TCE controller 812. For example, the control node 810 may control one or more TCEs to add a predetermined amount of heat to, and increase the temperature of, the ESC for the substrate "n." Similarly, the control node 810 may control one or more TCEs to remove a predetermined amount of heat from, and decrease the temperature of, the ESC for the substrate "n."

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a lithography chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature controller for a substrate processing system, the temperature controller comprising:
   an interface configured to receive a processing temperature, wherein the processing temperature corresponds to a desired processing temperature of a substrate; and
   a thermal control element (TCE) controller configured to selectively control a TCE to adjust a temperature of a substrate support, the TCE controller further configured to, prior to the substrate being loaded onto the substrate support,
      determine at least one of a temperature of the substrate support and a temperature of the substrate, and
      based on (i) the processing temperature and (ii) the at least one of the temperature of the substrate support and the temperature of the substrate, control the TCE to adjust the temperature of the substrate support to a setpoint temperature that is different than the processing temperature.

2. The temperature controller of claim 1, wherein, to control the TCE to adjust the temperature of the substrate support, the TCE controller is further configured to (i) determine whether the processing temperature and the temperature of the substrate are different and (ii) control the TCE based on the determination of whether the processing temperature and the temperature of the substrate are different.

3. The temperature controller of claim 1, wherein, to control the TCE to adjust the temperature of the substrate support, the TCE controller is further configured to (i) determine a difference between the processing temperature and the temperature of the substrate and (ii) control the TCE based on the difference between the processing temperature and the temperature of the substrate.

4. The temperature controller of claim 3, wherein the TCE controller is further configured to (i) determine, based on the difference, an amount of heat energy that will cause the temperature of the substrate to reach the processing temperature and (ii) control the TCE based on the amount of heat energy.

5. The temperature controller of claim 4, wherein the TCE controller is further configured to determine the amount of heat energy further based on a heat capacity constant of the substrate.

6. The temperature controller of claim 1, wherein the TCE controller is configured to control the TCE to adjust the temperature of the substrate support to the setpoint temperature that is different than the processing temperature for a predetermined period prior to loading the substrate onto the substrate support.

7. The temperature controller of claim 1, wherein, to control the TCE to adjust the temperature of the substrate support, the TCE controller is further configured to (i) determine whether the processing temperature and the temperature of the substrate support are different and (ii) control the TCE based on the determination of whether the processing temperature and the temperature of the substrate support are different.

8. The temperature controller of claim 1, wherein, to control the TCE to adjust the temperature of the substrate support, the TCE controller is further configured to (i) determine a difference between the processing temperature and the temperature of the substrate and (ii) control the TCE based on the difference between the processing temperature and the temperature of the substrate support.

9. The temperature controller of claim 1, wherein the TCE controller is further configured to calculate a temperature disturbance caused by loading the substrate onto the substrate support.

10. The temperature controller of claim 9, wherein the TCE controller is further configured to recalculate the temperature disturbance subsequent to loading the substrate onto the substrate support.

11. A method of controlling a substrate support in a substrate processing system, the method comprising:
    receiving a processing temperature, wherein the processing temperature corresponds to a desired processing temperature of a substrate; and
    prior to a substrate being loaded onto the substrate support,
       determining at least one of a temperature of the substrate support and a temperature of the substrate, and
       based on (i) the processing temperature and (ii) the at least one of the temperature of the substrate support and the temperature of the substrate, controlling a thermal control element (TCE) to adjust the temperature of the substrate support to a setpoint temperature that is different than the processing temperature.

12. The method of claim 11, wherein controlling the TCE to adjust the temperature of the substrate support includes (i) determining whether the processing temperature and the temperature of the substrate are different and (ii) controlling the TCE based on the determination of whether the processing temperature and the temperature of the substrate are different.

13. The method of claim 11, wherein controlling the TCE to adjust the temperature of the substrate support includes (i) determining a difference between the processing temperature and the temperature of the substrate and (ii) controlling the TCE based on the difference between the processing temperature and the temperature of the substrate.

14. The method of claim 13, further comprising (i) determining, based on the difference, an amount of heat energy that will cause the temperature of the substrate to reach the processing temperature and (ii) controlling the TCE based on the amount of heat energy.

15. The method of claim 14, further comprising determining the amount of heat energy further based on a heat capacity constant of the substrate.

16. The method of claim 11, further comprising controlling the TCE to adjust the temperature of the substrate support to the setpoint temperature that is different than the processing temperature for a predetermined period prior to loading the substrate onto the substrate support.

17. The method of claim 11, wherein controlling the TCE to adjust the temperature of the substrate support includes (i) determining whether the processing temperature and the temperature of the substrate support are different and (ii) controlling the TCE based on the determination of whether the processing temperature and the temperature of the substrate support are different.

18. The method of claim 11, wherein controlling the TCE to adjust the temperature of the substrate support includes (i) determining a difference between the processing temperature and the temperature of the substrate and (ii) controlling the TCE based on the difference between the processing temperature and the temperature of the substrate support.

19. The method of claim 11, further comprising calculating a temperature disturbance caused by loading the substrate onto the substrate support.

20. The method of claim 19, further comprising recalculating the temperature disturbance subsequent to loading the substrate onto the substrate support.

* * * * *